United States Patent
Yoon et al.

(10) Patent No.: US 10,553,743 B2
(45) Date of Patent: Feb. 4, 2020

(54) FLEXIBLE CRYSTALLINE ULTRA-THIN SI SOLAR CELLS

(71) Applicant: The Government of the United States of America, as represented by the Secretary of the Navy, Arlington, VA (US)

(72) Inventors: Woojun Yoon, Fairfax, VA (US); Phillip Jenkins, Cleveland Heights, OH (US); Robert J. Walters, Alexandria, VA (US); David Scheiman, Alexandria, VA (US)

(73) Assignee: The Government of the United States of America, as represented by the Secretary of the Navy, Washington, DC (US)

( * ) Notice: Subject to any disclaimer, the term of this patent is extended or adjusted under 35 U.S.C. 154(b) by 0 days.

(21) Appl. No.: 16/196,093

(22) Filed: Nov. 20, 2018

(65) Prior Publication Data
US 2019/0157497 A1    May 23, 2019

Related U.S. Application Data

(60) Provisional application No. 62/588,508, filed on Nov. 20, 2017.

(51) Int. Cl.
*H01L 21/31*    (2006.01)
*H01L 31/18*    (2006.01)
(Continued)

(52) U.S. Cl.
CPC .... *H01L 31/1896* (2013.01); *H01L 31/02363* (2013.01); *H01L 31/03921* (2013.01);
(Continued)

(58) Field of Classification Search
None
See application file for complete search history.

(56) References Cited

U.S. PATENT DOCUMENTS 8,936,961 B2 *   1/2015   Bedell .............. H01L 31/0684
                                                    438/68
2011/0186910 A1  8/2011   Forrest et al.
(Continued)

FOREIGN PATENT DOCUMENTS

WO       2014078664 A1    5/2014

OTHER PUBLICATIONS

R. Brendel, "Review of Layer Transfer Processes for Crystalline Thin-Film Silicon Solar Cells," Japanese Journal of Applied Physics, vol. 40 pp. 4431-4439, 2001.
(Continued)

*Primary Examiner* — Ali Naraghi
(74) *Attorney, Agent, or Firm* — US Naval Research Laboratory; Joslyn Barritt

(57) ABSTRACT

A novel, low cost method for manufacturing flexible crystalline ultra-thin Si solar cells using previously fabricated inflexible crystalline Si solar cells. A stack of metal layers is coated onto a front side of previously completed inflexible crystalline Si solar cells. The stack serves as a bonding layer as well as an electrically conducting layer between the inflexible solar cell and the carrier substrate. The front side of the coated inflexible Si solar cell is bonded onto the carrier substrate. Back side layers from the starting inflexible solar cell are removed, as is much of the base layer, so that only a thin base layer remains, with the thin base layer and emitter region having a total thickness of between 1 μm and 30 μm and the final cell having a total thickness of about 10 to about 125 μm.

6 Claims, 6 Drawing Sheets

Front Side Processing Of Bonded Solar Cell

(51) Int. Cl.
H01L 31/0236 (2006.01)
H01L 31/0392 (2006.01)
H01L 31/068 (2012.01)

(52) U.S. Cl.
CPC ........ *H01L 31/182* (2013.01); *H01L 31/1804* (2013.01); *H01L 31/186* (2013.01); *H01L 31/0682* (2013.01)

(56) References Cited

U.S. PATENT DOCUMENTS

| | | |
|---|---|---|
| 2012/0305060 A1 | 12/2012 | Fu et al. |
| 2013/0276888 A1 | 10/2013 | Munteanu et al. |
| 2016/0329057 A1 | 11/2016 | Forrest et al. |
| 2018/0226533 A1* | 8/2018 | Lochtefeld .......... H01L 31/1896 |

OTHER PUBLICATIONS

Isaac Tuah-Poku, M. Dollar, and T. B. Massalski, "A Study of the Transient Liquid Phase Bonding Process Applied to a Ag/Cu/Ag Sandwich Joint," Metallurgical Transactions A, vol. 19A, Mar. 1988, pp. 675-686.

Sang Won Yoon, Michael D. Glover, and Koji Shiozaki, "Nickel-Tin Transient Liquid Phase Bonding Toward High-Temperature Operational Power Electronics in Electrified Vehicles," IEEE Transactions on Power Electronics, vol. 28, No. 5, May 2013, pp. 2448-2456.

K. Chu, et al., "A comparative study of Cn/Sn/Cu and Ni/Sn/Ni solder joints for low temperature stable transient liquid phase bonding," Scripta Materialia, vol. 109, pp. 113-117, 2015.

G. O. Cook et al., "Overview of transient liquid phase and partial transient liquid phase bonding," Journal of Materials Science, vol. 46, pp. 5305-5323, 2011.

S. Marauska, et al., "Low temperature transient liquid phase bonding of Au/Sn and Cu/Sn electroplated material systems for MEMS wafer-level packaging," Microsystem Technologies, vol. 19, pp. 1119-1130, 2013.

Y. Natsume, et al., "Numerical Modeling of the Transient Liquid-phase Diffusion Bonding Process of Al Using Cu Filler Metal," ISIJ International, vol. 43, pp. 1976-1982, 2003.

W. Yoon, et al., "Transparent conducting oxide-based, passivated contacts for high efficiency crystalline Si solar cells," in 2015 IEEE 42nd Photovoltaic Specialist Conference (PVSC), 2015, pp. 1-4.

W. Yoon, et al., "Enhanced surface passivation of epitaxially grown emitters for high-efficiency ultrathin crystalline Si solar cells," in 2016 IEEE 43rd Photovoltaic Specialists Conference (PVSC), 2016, pp. 3008-3010.

Search Report and Written Opinion dated Mar. 8, 2019, in corresponding International Application No. PCT/US2018/061943.

* cited by examiner

Carrier Substrate Preparation

Inflexible Crystalline Thick Si Solar Cell Preparation

**Bonding of Crystalline Thick Si Solar Cell
To Carrier Substrate**

FLEXIBLE CRYSTALLINE ULTRA-THIN SI SOLAR CELLS

CROSS-REFERENCE

This Application is a Nonprovisional of, and claims the benefit of priority under 35 U.S.C. § 119 based on, U.S. Provisional Patent Application No. 62/588,508 filed on Nov. 20, 2017. The Provisional Application and all references cited herein are hereby incorporated by reference into the present disclosure in their entirety.

TECHNICAL FIELD

The present disclosure relates to flexible crystalline ultra-thin (about 1 μm to about 20 μm) Si solar cells bonded on flexible conductive foil (about 10 μm to about 125 μm) and methods for fabricating the same.

BACKGROUND

Conventional manufacturing processes for producing commercially available high-efficiency and large-area Si solar cells depend heavily on the use of thick crystalline Si wafer (100 μm~500 μm). Due to the rigid and brittle nature of such thick crystalline Si wafers including both mono- and multi-crystalline Si wafers, wafer-based crystalline Si solar cells (100 μm~300 μm) are not compatible with ultra-thin and fully flexible form factors suitable for covering curved surfaces. In addition, most solar modules and panels consisting of thick crystalline Si solar cells require heavy front glass covers and aluminum frames to protect them from environmental factors such as hail, rocks, wind etc., making them difficult to integrate into light-weight packaging using non-glass based materials such as fluorine-based plastics, carbon fiber, fiberglass or foam molding that can enable tailored output optimized to power systems.

Flexible crystalline Si solar cells can be manufactured using intrinsically ultra-thin crystalline Si wafers that are wire-cut into less than approximately 50 μm during wafer slicing of semiconductor ingot. However, overcoming the yield losses and handling issues such as cracks and breakage that are a problem for traditional thin wafer processing is extremely difficult and limits their usefulness in fabricating operationally suitable solar cells.

Conventional manufacturing methods for producing crystalline thin Si solar cells are based on epitaxial growth of monocrystalline Si layers onto a donor Si wafer followed by an epitaxial layer transfer process (LTP). For monocrystalline thin Si solar cells (less than 50 um), the epitaxial growth and LTP approach has demonstrated a potentially viable way to achieve high-performance crystalline thin Si solar cells. See R. Brendel, "Review of Layer Transfer Processes for Crystalline Thin-Film Silicon Solar Cells," *Japanese Journal of Applied Physics*, Vol. 40 pp. 4431-4439, 2001. This approach uses a special surface conditioning of the donor Si substrate that permits the transfer of the active device layer from a re-usable growth substrate to a device carrier. A special surface conditioning method includes oxidation; implantation of hydrogen (H+) ions; and formation of porous Si, textured porous Si, and selective etching layers. However, this approach requires deposition or epitaxial growth of crystalline semiconductor layers using high-vacuum epitaxial tools (e.g., chemical vapor deposition (CVD)-based systems, molecular-beam epitaxy (MBE) systems, or high vacuum electron-beam evaporation systems) for device layer formation on a foreign or native substrate at high temperature, which requires extremely high capital expenditure (CAPEX) and high maintenance cost. It also requires optional re-crystallization in a high temperature (e.g. >700° C.) and layer separation processing including delicate cleaving or complex wet chemical etching.

Manufacture of ultra-thin flexible crystalline GaAs solar cells can also be enabled by epitaxial growth of GaAs layers on GaAs substrate and then epitaxial liftoff (ELO) process, which is epitaxial growth of a thin lattice-matched AlAs layer grown between the wafer and an active GaAs device, and then slowly selectively etched by HF acid. However, this approach also requires epitaxial growth of crystalline GaAs device layers using high-vacuum epitaxial tools, such as metal-organic CVD (MOCVD), MBE or hydride vapor phase epitaxy (HVPE) for device layer formation on a donor wafer. In addition, the ELO process is extremely slow and it suffers from poor post ELO wafer surface quality, requiring an additional surface treatment for wafer re-use.

SUMMARY

This summary is intended to introduce, in simplified form, a selection of concepts that are further described in the Detailed Description. This summary is not intended to identify key or essential features of the claimed subject matter, nor is it intended to be used as an aid in determining the scope of the claimed subject matter. Instead, it is merely presented as a brief overview of the subject matter described and claimed herein.

The present invention provides a novel, low cost method for manufacturing flexible crystalline ultra-thin (about 1 μm to about 20 μm) Si solar cells bonded on flexible conductive foil using previously fabricated inflexible crystalline Si solar cells.

In the method in accordance with the present invention, a carrier substrate comprising a thin, flexible conductive foil, an adhesion layer, a metal base layer, and a metal interlayer is prepared. A previously completed inflexible crystalline Si solar cell is provided, where the inflexible crystalline Si solar cell includes a plurality of metal grid fingers formed on a textured front surface of the emitter. A stack of metal layers is coated onto the front side of the inflexible crystalline Si solar cell, where the stack serves as a bonding layer as well as an electrically conducting layer between the inflexible solar cell and the carrier substrate.

The prepared inflexible Si solar cell is then inverted and bonded to the carrier substrate, where the metal layers diffuse and combine to form a bonded layer. Once the front side of the inflexible Si solar cell is bonded onto the carrier substrate, the front side of the bonded structure is ground to reach a total thickness that is about 40 μm above the final total thickness, followed by lapping until the final total thickness is achieved. The subsurface damage can be further removed by a Si surface texturing process. These processes remove materials from the rear-side of rigid solar cells, such as rear-side contact metal, dielectric layers, heavily doped semiconducting region that provides back-surface field (BSF) in the inflexible Si solar cell, and some of bulk crystalline Si materials.

In order to improve chemical surface passivation, a thin tunneling layer can be formed on the front-side of ultra-thin crystalline solar cell bonded on the carrier substrate. Then a thin carrier-selective layer can be formed on the thin tunneling layer to improve field-effect surface passivation by providing carrier-selectivity. In order to improve later conduction on the front side while allowing light absorption, transparent conducting oxide (TCO) layer can be formed, followed by forming metal grid fingers.

DETAILED DESCRIPTION

The aspects and features of the present invention summarized above can be embodied in various forms. The following description shows, by way of illustration, combinations and configurations in which the aspects and features can be put into practice. It is understood that the described aspects, features, and/or embodiments are merely examples, and that one skilled in the art may utilize other aspects, features, and/or embodiments or make structural and functional modifications without departing from the scope of the present disclosure.

The present disclosure provides a flexible crystalline ultra-thin (about 1 µm to about 20 µm) Si solar cells bonded on flexible conductive foil (about 10 µm to about 125 µm) and a method for manufacturing the same from a pre-existing thick, inflexible crystalline Si solar cell that is already commercially available.

Aspects of the solar cell and method for manufacturing thereof are described herein with reference to the FIGURES submitted with and forming a part of the present application. It will be noted here that in the FIGURES, when the same element is presented in different FIGURES, it has the same reference number, with only the first digit being changed to reflect the FIG. 1n which it is presented. For example, the flexible conductive foil in the carrier substrate is shown with reference number 201 in FIG. 2 and with reference number 401 in FIGS. 4B and 4C.

Figure 1:
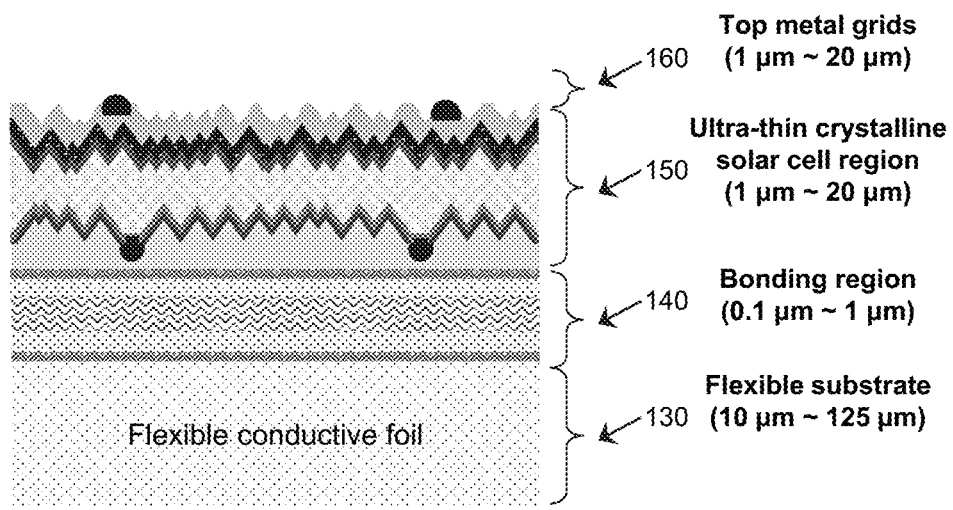
FIG. 1 is a block schematic illustrating aspects of an exemplary completed flexible crystalline ultra-thin solar cell produced from an inflexible crystalline Si solar cell in accordance with the present disclosure.

FIG. 1 illustrates aspects of an exemplary flexible crystalline ultra-thin Si solar cell in accordance with the present invention. As illustrated in FIG. 1, such a flexible crystalline ultra-thin Si solar cell includes a flexible substrate 130 having a thickness between 10 µm to 125 µm, a bonding region 140 having a thickness between about 0.1 µm and about 1 an ultra-thin crystalline Si solar cell active layer 150 having a thickness between about 1 µm and about 20 and top metal grids 160, consisting of fingers and busbars having a thickness between about 1 µm and about 20 µm, extending on the front surface of the active layer of the solar cell. Each of these regions will be described in more detail below. In addition, as shown in FIG. 1, an flexible ultra-thin crystalline Si solar cell in accordance with the present invention includes a first textured surface between a bonding region 140 and ultra-thin crystalline Si solar cell active layer 150, and further includes a second textured surface formed on top of ultra-thin crystalline Si solar cell active layer 150. In the preferred embodiment (100) oriented monocrystalline Si wafers are used. A KOH based solution is then used to preferentially expose the (111) planes of Si on the front side, forming a textured surface with random upright pyramids with height ranging from 1 µm to 5 µm.

In contrast to solar cells made using conventional approaches that utilize an epitaxial growth and epi-layer transfer process, the flexible ultra-thin crystalline solar cells in accordance with the present invention offer significant advantages. Because they utilize pre-existing commercial crystalline Si solar cells as an initial component, the crystalline ultra-thin Si solar cells in accordance with the present invention have excellent light trapping properties as compared to conventional solar cells. As described in more detail below, a pre-existing front-side textured Si surface in the initial inflexible Si solar cell will be on the back side of a flexible ultra-thin Si solar cell in accordance with the present invention so that the solar cell has a textured surface on both the front and back sides, enabling it to capture and internally reflect incident light, significantly enhancing the coupling of light into the ultra-thin Si solar cells and thus improving its power conversion efficiency and providing better gain as compared to conventional cells which typically have a textured surface on the only one side.

The flexible conductive carrier and the bonding layer can withstand temperatures over 700° C., allowing process optimization of grinding, lapping, and front side processing without significant temperature restrictions. In addition, the ultra-thin crystalline solar cell in accordance with the present invention is bonded to a flexible conductive foil, which allows it to take advantage of the reduced bend radius of ultra-thin crystalline Si films, can greatly minimize cracking risk under flexure. When these flexible ultra-thin crystalline Si solar cells are assembled into a solar module, precise alignment with rear-side bus bar of the solar cells is not necessary, as is required for conventional module processing, due to the utilization of full-area rear side conductive foil as a rear contact in an ultra-thin crystalline Si solar cell.

The present disclosure also provides a method for making such a solar cell from a pre-existing thick, inflexible crystalline solar cell. The method of the present invention can be used with any suitable inflexible Si solar cell, enabling production of ultra-thin, flexible Si solar cells from a wide range of pre-existing solar cell structures such as Al-Back Surface Field (Al-BSF) cell, p-Passivated Emitter Rear Contact (p-PERC) cell, p-Passivated Emitter Rear Locally diffused (p-PERL) cell, n-Passivated Emitter Rear Totally diffused (n-PERT) cell, and Silicon Hetero Junction (SHJ) cell, including those that can be readily obtained in the marketplace for both monofacial and bifacial Si solar cells. More importantly, it does not require commercial epitaxial growth tools for growing crystalline materials, which requires extremely high CAPEX and high maintenance costs.

In many embodiments such as the embodiment described below, the method for producing a flexible crystalline ultrathin Si solar cell from a previously fabricated thick, inflexible crystalline Si solar cell in accordance with the present invention employs commonly used metal layer bonding methods (e.g. eutectic bonding, solder bonding, thermoscompression bonding, transient liquid phase (TLP) diffusion bonding) to bond a previously produced solar cell to a thin, flexible conductive foil. Particularly, the advantage of using a TLP diffusion bonding process is that the formation of brittle phases in the bond region can be avoided. In addition, compared to other bonding technologies, this TLP bonding process is particular advantageous because a TLP bonded fixture has a greater tolerance for high temperature, allowing for the front side processing in this invention to be compatible with existing commercial solar cell manufacturing processes, such as forming additional layers at an elevated temperature, thermal annealing at an elevated temperature, and firing process of screen printed grid fingers. However, one skilled in the art will readily understand that other suitable bonding schemes and methods can be used, and use of all such alternative bonding schemes and methods is deemed to be within the scope of the present disclosure.

Exemplary TLP diffusion bonding material systems that can be used for solar cell bonding applications include (1) Sn-based material systems (e.g., Ni—Sn—Ni, Ag—Sn—Ag, Au—Sn—Au, and Cu—Sn—Cu); (2) In-based material systems (e.g., Au—In—Au, Ag—In—Ag); and (3) Cu-based material systems (e.g., Cu—Al—Cu), though other material systems can be used as appropriate. See Poku, supra, and Yoon, supra; see also K. Chu, et al., "A comparative study of Cn/Sn/Cu and Ni/Sn/Ni solder joints for low temperature stable transient liquid phase bonding," *Scripta Materialia*, vol. 109, pp. 113-117, 2015; G. O. Cook et al., "Overview of transient liquid phase and partial transient liquid phase bonding," *Journal of Materials Science*, vol. 46, pp. 5305-5323, 2011; S. Marauska, et al., "Low temperature transient liquid phase bonding of Au/Sn and Cu/Sn electroplated material systems for MEMS wafer-level packaging," *Microsystem Technologies*, vol. 19, pp. 1119-1130, 2013; and Y. Natsume, et al., "Numerical Modeling of the Transient Liquid-phase Diffusion Bonding Process of Al Using Cu Filler Metal," *ISIJ International*, vol. 43, pp. 1976-1982, 2003.

Aspects of process steps in an exemplary implementation of a method for manufacturing a flexible crystalline ultra-thin Si solar cell from a pre-existing thick inflexible crystalline Si solar cell are shown in FIGS. 2-6 and are described below.

Figure 2:
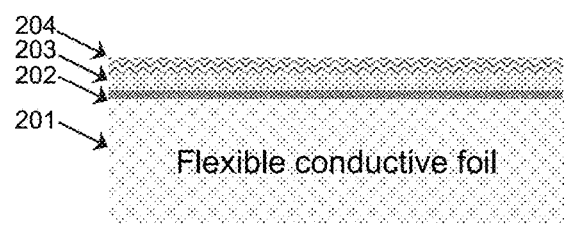
FIG. 2 is a block schematic illustrating aspects of preparation of a carrier substrate for use in a method for manufacturing a flexible crystalline ultra-thin Si solar cell in accordance with the present disclosure.

As described above, a process for manufacturing a flexible crystalline ultra-thin solar cell in accordance with the present invention involves the bonding of a preexisting thick, inflexible crystalline solar cell to a thin, flexible conductive carrier substrate that has been prepared for the bonding process. Thus, as illustrated in FIG. 2, in accordance with the present invention, the carrier substrate can comprise a thin, flexible conductive foil 201 having a thickness in the range from 10 μm to 125 μm with additional layers deposited thereon so that it may be bonded to the thick, inflexible solar cell as described below. Conductive foil 201 in the substrate can comprise any suitable conductive material such as a stainless steel alloy (e.g. 200 or 300 series) or a controlled expansion alloy (e.g. Invar, Super Invar, Kovar, Alloy 42). A thin (<~10 nm) adhesion layer 202 (e.g. Ti, Cr, Ni) may be deposited on a front surface of foil 201, followed by a stack comprising a metal base layer 203 (e.g. Ag, Cu, Al, Ni) and a metal interlayer 204 (e.g. Sn, In, Cu).

Figures 3A, 3B:
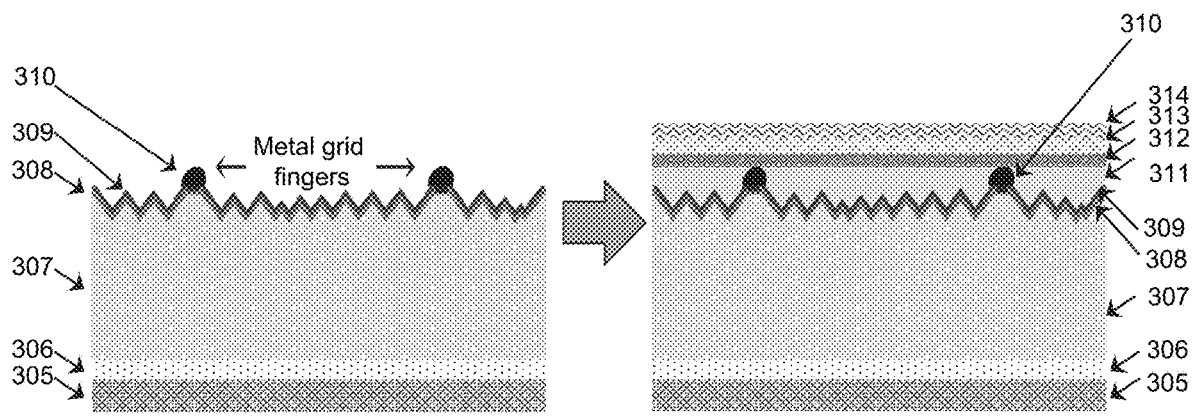
FIGS. 3A and 3B are block schematics illustrating aspects of preparation of an inflexible crystalline solar cell for use in a method for manufacturing a flexible crystalline ultra-thin Si solar cell in accordance with the present disclosure.

As illustrated in FIG. 3A, a conventional pre-existing thick, inflexible Si solar cell used in the manufacturing process in accordance with the present invention typically will include a back contact layer 305 (e. g. Al and Ag) and back-surface field (BSF) region 306 (e.g. mono- and multicrystalline Si doped by phosphorous, mono- and multicrystalline Si doped by boron, monocrystalline Si doped by Al), plus base layer 307 (e.g. n-type mono- and multicrystalline Si, p-type mono- and multicrystalline Si), emitter region 308 (e.g. mono- and multicrystalline Si doped by phosphorous, mono- and multicrystalline Si doped by boron). The back-surface field (BSF) region 306 can be either a full-area of Al-diffused Si (e.g. Al-BSF cell) or a full-area of doped Si (e.g. n-PERT, SHJ cell) or locally doped Si throughout local openings of dielectric layers (e.g. p-PERC, p-PERL). The solar cell also includes an anti-reflection coating (ARC) layer 309 (e.g. SiNx, SiO2, Al2O3, SiONx), where ARC layer 309 also acts as a surface passivation layer to provide surface passivation to emitter region 308 on the textured Si surface.

In addition, as illustrated in FIG. 3A, the pre-existing solar cell also includes top contact metal grids 310, consisting of fingers and busbars, typically both having a height of about 1 μm to 20 μm, extending from above the upper surface of ARC layer 309 through the cell into emitter region 308 to collect the current generated by a solar cell. Busbars are connected directly to the external leads, while fingers are finer areas of metallization which collect current for delivery to the busbars. The textured Si surface may take any suitable form; for example, the texture features may in the form of either planar or inverted pyramids or may be random upright pyramids, with the pyramids having a height in the range of 1 μm to 5 μm. The pre-existing cell is typically formed on a wafer, and has a thickness of about 180 μm, not including any back metal layers, the ARC layer, or the metal grids.

The thick, inflexible solar cell is then prepared for bonding to the flexible carrier substrate. As illustrated in FIG. 3B, a planarization metal layer 311, adhesion layer 312, metal base layer 313, and metal interlayer 314 are deposited on an upper surface of ARC layer 309, where adhesion layer 312, metal base layer 313, and metal interlayer 314 are formed from the same materials used for the corresponding adhesion layer 202, metal base layer 203, and metal interlayer 204 deposited on the upper surface of flexible conductive foil 201 of the carrier substrate.

Figure 4A:
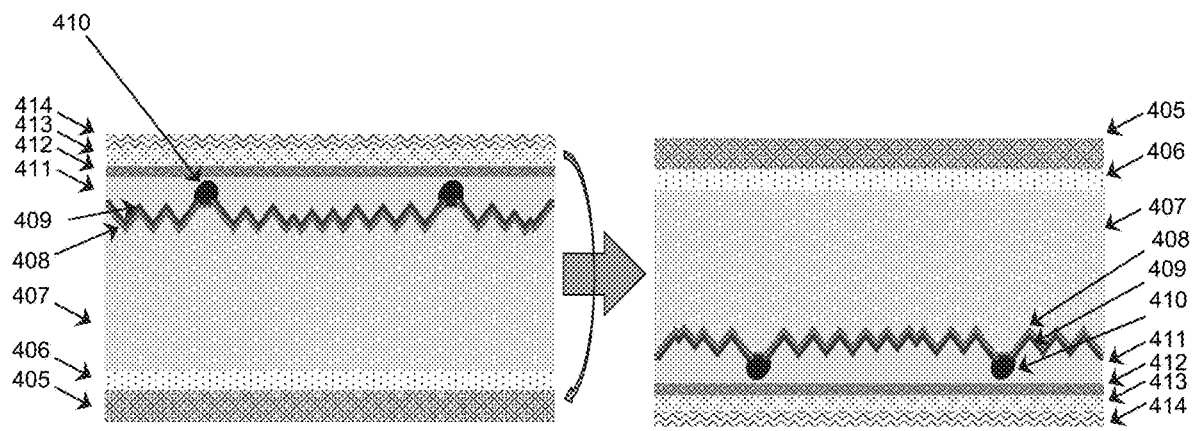
FIGS. 4A-4C are block schematics illustrating aspects of the bonding of an inflexible crystalline solar cell to a thin, flexible, electrically conductive carrier substrate by means of wafer bonding in a method for manufacturing a flexible crystalline ultra-thin Si solar cell in accordance with the present disclosure.
Figure 4B:
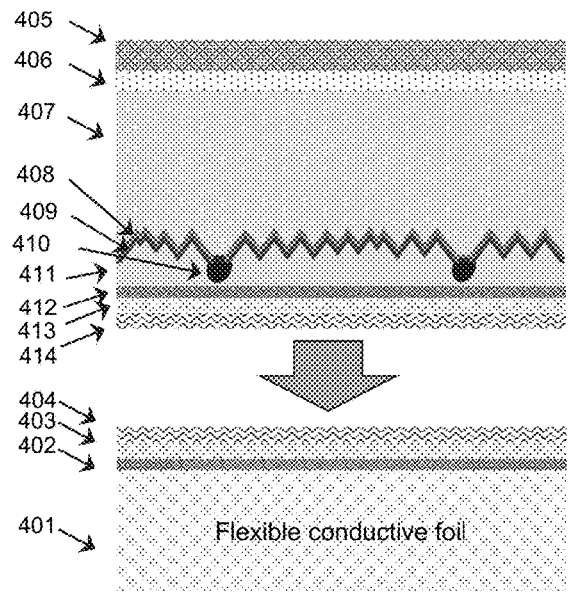
Figure 4C:
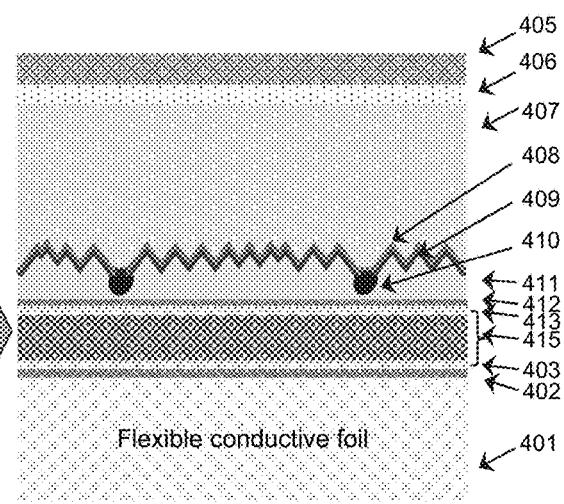

The thus-prepared thick, inflexible crystalline solar cell is then mounted to the carrier substrate. As shown in FIG. 4A, the prepared thick, inflexible crystalline solar cell is inverted so that the back contact layer 405, back surface field layer 406, base layer 407, and emitter region 408 are on the "top" and planarization metal layer 411, adhesion layer 412, metal base layer 413, and metal interlayer 414 are on the "bottom." Then, as illustrated in FIG. 4B, the inverted thick, inflexible crystalline solar cell and the carrier substrate are bonded face-to-face to form a bonded solar cell such as that shown in FIG. 4C. Thus, as illustrated in FIGS. 4B and 4C, metal interlayer 414 in the thick, inflexible crystalline solar cell is bonded to metal interlayer 404 in the carrier substrate to form blended bonded layer 415 shown in FIG. 4C (corresponding to bonding region 150 shown in FIG. 1), where bonded layer 415 is formed after dissolution of the metals from metal interlayers 404 in the flexible substrate and the metals from metal interlayer 414 in the thick inflexible Si solar cell, which are then homogenized. The homogenized metals are then mixed with the metals from the metal base layers 403 in the flexible substrate and the metal base layers 413 from the flexible thin Si solar cell, with only a portion of each metal base layer being consumed in this mixing process. In addition, the textured ARC and the metal grid pillars which were on the front surface of the thick, inflexible solar cell are now contained within the bonded cell as textured back-surface ARC 409 and metal grid 410. The entire structure is now situated on thin, flexible conductive foil 401.

As noted above, although other bonding methods may be used as suitable, in many embodiments, the most preferred method for bonding the thick, inflexible crystalline solar cell to the carrier substrate will be by means of TLP bonding mainly because the resulting bonds have a higher melting point than the bonding temperature, enabling the use of further high-temperature processing steps such as formation of additional layers at an elevated temperature, thermal annealing at an elevated temperature, and firing of screen printed grids. TLP diffusion bonding of the prepared inverted thick, inflexible crystalline solar cell to the prepared carrier substrate can be carried out using any suitable bonding system such as the currently available EVG® series, SUSS MicroTec: XBS series, SB6/8 GEN2, or XB8 systems. Bonding can be carried out under an inert atmosphere with a bonding force in the range of 10 kN to 100 kN, with the two parts being heated to a predetermined temperature between 150° C. and 700° C. and then isothermally held for a predetermined time, with the specific bonding force, temperature, and time being determined by the materials to be bonded as well as the bonding system used. See Chu et al., supra.

Figure 5:
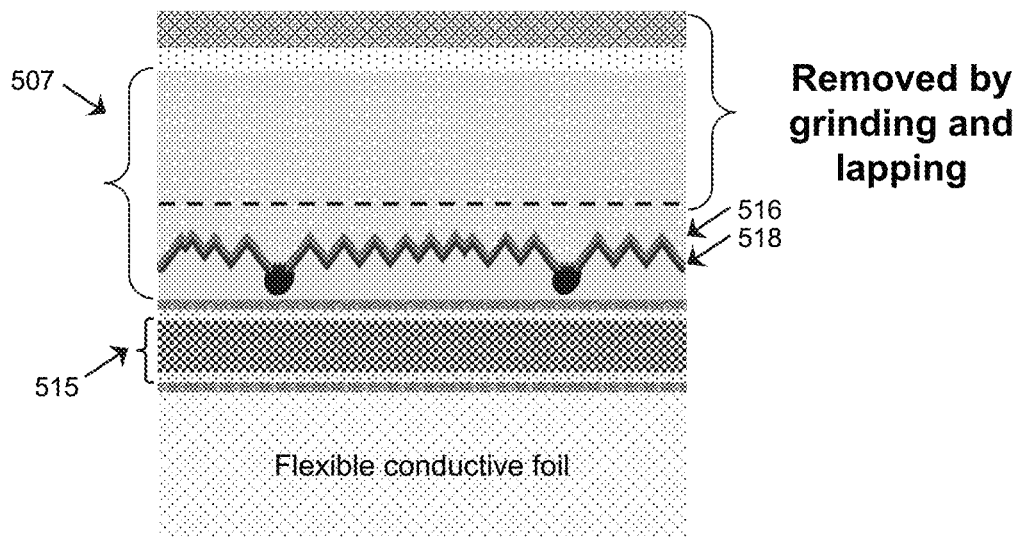
FIG. 5 is a block schematic illustrating aspects of additional processing steps in a method for manufacturing a flexible crystalline ultra-thin Si solar cell in accordance with the present disclosure.

After formation of the bonded solar cell shown in FIG. 4C, as illustrated in FIG. 5, back contact metal layer 505 and back-surface field (BSF) region 506 on the front side of the bonded solar cell are completely removed from the bonded solar cell. In addition, base layer 507 is also partially removed during this step so that only a thin base layer 516 remains, with the thin base layer 516 and an emitter region 508 having a total thickness of between 1 µm and 30 µm, preferably between 10 µm and 20 µm, and more preferably between 1 µm and 10 µm. Removal of these layers can be accomplished by any suitable method, typically means of grinding and lapping, the layers away. Grinding is a quick and relatively easy process. However, it can create deep subsurface damage in the surface of base region in the depth of more than 40 µm due to use of a coarse bonded abrasive. To remedy this damage, the damaged subsurface region of the front side of the ultra-thin bonded structure can then be removed by a lapping process known in the art to produce a smooth, flat, unpolished surfaces. The lapping plate will rotate at a low speed less than 80 rpm and a mid-range abrasive particle between 5 µm to 20 µm is typically used to produce the desired thickness and degree of flatness.

Figure 6:
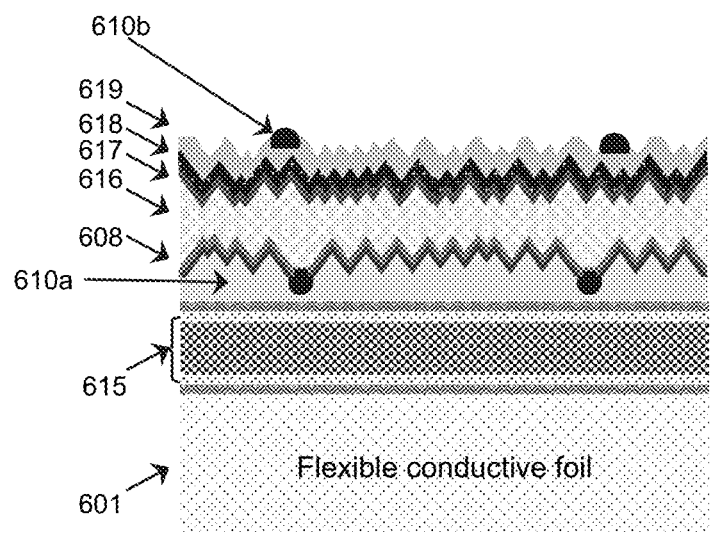
FIG. 6 is a block schematic illustrating aspects of further additional processing steps in a method for manufacturing a flexible crystalline ultra-thin Si solar cell in accordance with the present disclosure.

Finally, as illustrated in FIG. 6, the ultra-thin structure undergoes frontside processing to make it suitable for use as a solar cell.

Surface texturing can be performed on the front surface of the ultra-thin structure to from random upright pyramids through chemical etching in order to increase optical absorption. In the preferred embodiment (100) oriented monocrystalline Si wafers are used. A KOH based solution is then used to preferentially expose the (111) planes of Si on the front side, forming a textured surface with random upright pyramids with height ranging from 1 µm to 5 µm. On the textured front surface of the ultra-thin structure, textured surface passivation can be achieved through the deposition of an ultra-thin (<2 nm) tunneling layer 617 on the front surface of textured thin base layer 616, where the tunnel layer can comprise a layer of a dielectric such as $Al_2O_3$, $SiO_2$, or hydrogenated intrinsic amorphous Si. See W. Yoon, et al., "Transparent conducting oxide-based, passivated contacts for high efficiency crystalline Si solar cells," in 2015 *IEEE 42nd Photovoltaic Specialist Conference (PVSC)*, 2015, pp. 1-4 ("Yoon 2015"); and W. Yoon, et al., "Enhanced surface passivation of epitaxially grown emitters for high-efficiency ultrathin crystalline Si solar cells," in 2016 *IEEE 43rd Photovoltaic Specialists Conference (PVSC)*, 2016, pp. 3008-3010 ("Yoon 2016"). These dielectric layers can be deposited by any suitable process such as thermal atomic layer deposition (ALD), remote plasma ALD, plasma enhanced chemical vapor deposition (PECVD), wet oxidation, UV-Ozone oxidation and DC/RF sputtering, or thermal- and e-beam evaporation. If thicker passivation layers are found to be desired, local contacts through thicker passivation layers can be formed using a laser ablation process, screen-printing and firing step. See Yoon 2015 and Yoon 2016, supra.

Carrier-selective contact layers 618 can then be deposited on passivating tunnel layer 617 to enhance carrier-selectivity of charge carriers, where the carrier-selective contact layers can include layers of materials such as TiOx, MoOx, NiOx, MgOx, LiF, hydrogenated poly-Si doped with phosphorus, hydrogenated poly-Si doped with boron, hydrogenated amorphous Si doped with phosphorus and hydrogenated amorphous Si doped with boron. See Yoon 2016, supra. The optimal thickness of carrier-selective contact layers is in the range of 1 nm to 20 nm.

Transparent conducting oxide (TCO) layers 619 can then be deposited on carrier-selective contact layer 618 to form a lateral conduction layer to minimize the electrical ohmic loss, where the TCO layers can include layers of materials such as indium doped tin oxide (ITO), hydrogenated indium oxide, fluorine doped tin oxide (FTO), aluminum doped zinc oxide (AZO). See Yoon 2016, supra. The optimal thickness of TCO layers is in the range of 50 nm to 100 nm with the sheet resistance between 50 ohm/sq and 120 ohm/sq.

Finally, a second set of top metal contact grids 610b is formed on the front surface of TCO layers 619, where the second set of metal contact grids extend from below the front surface of the base layer to above the front surface of TCO layers 619. The metal contact grids 610b can be formed on the front surface of the structure via screen-printing using low temperature metal pastes (e.g. Ag, Al, Ag/Al) or physical vapor deposition of Ti/Pd/Ag or electroplating of Ni/Cu or electroless-plated Ni/electroplating Cu.

The completed structure forms a flexible ultra-thin crystalline Si solar cell as shown in FIG. 1 described above, where the total thickness of the ultra-thin Si regions in the completed solar cell is between about 1 and about 20 µm.

Advantages and New Features

While the conventional LTP process for making flexible Si solar cells yields planar Si films lacking light-trapping ability, the cell structure of ultra-thin crystalline Si solar cells produced in accordance with the present invention has both front and back surface texturing that provide highly efficient light trapping, which significantly enhances the coupling of light into the ultra-thin Si solar cells and thus improves power conversion efficiency. The invented method also provides an ideal solar cell structure for integration of high-efficiency cell concepts such as carrier-selective contacts with use of a thin tunneling layer.

Compared to the conventional methods based on epitaxial growth of crystalline materials and epi-layer transfer process used to produce flexible ultra-thin crystalline solar cells, the present invention provides a highly novel method for making a crystalline thin Si solar cell because it is based on non-epitaxial growth of crystalline materials. This method can also be applied to various structures of commercial crystalline Si solar cells, such as Al-Back Surface Field (Al-BSF) cell, p-Passivated Emitter Rear Contact (p-PERC) cell, p-Passivated Emitter Rear Locally diffused (p-PERL) cell, n-Passivated Emitter Rear Totally diffused (n-PERT) cell, and Silicon Hetero Junction (SHJ) cell. In addition, this method can be applied to both monofacial and bifacial crystalline Si solar cells as well as to both mono-crystalline and multicrystalline Si solar cells. Mechanical grinding can be used for the rapid removal of premade solar cells to reduce it to a desired thickness. The grinding wheel or plated typically rotates at a high speed between 200 rpm and 1000 rpm and a coarse, bonded abrasive (>40 µm) is used. Grinding is quick and relatively easy process but it can create deep sub-surface damage in crystalline materials. Such subsurface damage can be mitigated by lapping, which is the removal of materials to produce a smooth, flat, unpolished surfaces. The lapping plate will rotate at a low speed less than 80 rpm and a mid-range abrasive particle between 5 µm to 20 µm is typically used. Lapping process is highly suitable for removing subsurface damage caused by grinding and produce the required thickness and flatness. Using existing completed and inflexible crystalline solar cells, flexible crystalline ultra-thin solar cells can be produced without using epitaxial growth or exfoliation process when mechanical grinding and lapping is combined with suitable fabrication process. The present invention also significantly reduces the number of manufacturing steps to produce flexible crystalline ultra-thin Si solar cells because it utilized pre-fabricated, completed Si solar cells based on rigid, inflexible crystalline Si wafers.

The main advantage of the methods disclosed in this invention is the utilization of completed thick crystalline solar cells that are already commercially available in order to create flexible ultra-thin crystalline solar cells. By using commercially available completed thick crystalline solar cells provides, we can benefit from its abundance, already proven high power output, and large-area cell. In addition, the disclosed invention enables the production of flexible crystalline ultra-thin Si solar cells without using deposition or epitaxial growth tools that requires extremely high capital, control, and maintenance system costs. Finally, the disclosed processes allow implementation of high-efficiency cell features that have been originally developed for standard cell processes, such as formation of high quality surface passivation using a combination of a tunneling layer and a carrier-selective contact layer, front-surface texturing, screen-printing/firing and plating process.

Alternatives

The main alternative to the approach given here is LTP process that requires surface re-conditioning and deposition or epitaxial growth of crystalline semiconductor layers using high-vacuum epitaxial tools for device layer formation. Another approach, which does not require growth of epitaxial crystalline materials, uses spallation technique, where a stressor layer on the silicon surface is used to exfoliate a thin Si layer. However, the spalling technique is so far limited to producing a small area of thin Si layers, which is not suitable for manufacturing large-area crystalline Si solar cell with high throughput.

Although particular embodiments, aspects, and features have been described and illustrated, one skilled in the art would readily appreciate that the invention described herein is not limited to only those embodiments, aspects, and features but also contemplates any and all modifications and alternative embodiments that are within the spirit and scope of the underlying invention described and claimed herein. The present application contemplates any and all modifications within the spirit and scope of the underlying invention described and claimed herein, and all such modifications and alternative embodiments are deemed to be within the scope and spirit of the present disclosure.

What is claimed is:

1. A method for making a flexible crystalline ultra-thin silicon (Si) solar cell, comprising:
   receiving a pre-existing inflexible crystalline Si solar cell comprising a back contact layer;
   a back-surface field layer disposed on an upper surface of the back contact layer; a base layer disposed on an upper surface of the back-surface field layer; an emitter disposed on an upper surface of the base layer, a front side of the emitter having a textured surface; an anti-reflective coating (ARC) layer disposed on the textured front side of the emitter; and a plurality of first top metal contact grids on an upper surface of the ARC layer, the metal contact grids extending from below a front surface of the emitter to above front surface of the ARC layer;
   preparing a carrier substrate by depositing a first adhesion layer on an upper surface of a flexible, conductive foil; depositing a first metal base layer on an upper surface of the adhesion layer; and depositing a first metal interlayer on an upper surface of the first metal base layer;
   preparing the pre-existing inflexible crystalline Si solar cell for mounting on the carrier substrate, the preparation including depositing a planarization metal layer on an upper surface of the ARC layer; depositing a second adhesion layer on an upper surface of the planarization metal layer; depositing a second metal base layer on an upper surface of the second adhesion layer; and depositing a second metal interlayer on an upper surface of the second metal base layer, the second adhesion layer, the second metal base layer, and the second metal interlayer being formed from the same material as the corresponding first adhesion layer, first metal base layer, and first metal interlayer in the carrier substrate;
   inverting the prepared pre-existing inflexible crystalline Si solar cell to that the second metal interlayer in the pre-existing inflexible crystalline Si solar cell faces the first metal interlayer in the carrier substrate;
   bonding the inverted pre-existing inflexible crystalline Si solar cell to the carrier substrate to form a bonded structure situated on the flexible conductive foil, wherein the first metal interlayer is bonded to the second metal interlayer to form a blended bonded metal layer comprising metals from the first and second metal interlayers mixed with metals from the first and second metal base layers, and wherein the first textured ARC and the first metal grid pillars are contained within the bonded structure;
   completely removing the back layer and the back surface field layer from the bonded structure;
   partially removing the base layer from the bonded structure so that the remaining base layer has a reduced thickness of between about 1 and about 30 µm;
   texturing a front surface of the remaining base layer;
   depositing a passivating tunneling layer on the textured front surface of the base layer;
   depositing carrier-selective contact layers on the passivating tunnel layer;
   depositing a transparent conducting oxide (TCO) layer on the carrier-selective layer; and forming a set of second top metal contact grids on a front surface of the TCO layer, the second top metal contact grids extending from below the front surface of the base layer to above the front surface of the TCO layer;

wherein a total thickness of ultra-thin Si regions in the completed solar cell is between about 1 and about 20 µm.

2. The method according to claim 1, wherein the flexible conductive foil has a thickness of about 10 to about 125 µm.

3. The method according to claim 1, wherein the blended bonded region in the flexible crystalline ultra-thin Si solar cell has a thickness of about 0.1 to about 1 µm.

4. The method according to claim 1, wherein the pre-existing inflexible Si solar cell comprises a (100) oriented monocrystalline Si wafer.

5. The method according to claim 1, wherein the pre-existing inflexible Si solar cell comprises a multicrystalline Si wafer.

6. The method according to claim 1, wherein the pre-existing inflexible Si solar cell is bonded to the carrier substrate by means of transient liquid phase (TLP) diffusion bonding.

\* \* \* \* \*